(12) United States Patent
Fernandez et al.

(10) Patent No.: US 12,345,836 B2
(45) Date of Patent: Jul. 1, 2025

(54) FILTERING MEASUREMENT DATA OF AN ACTIVE OPTICAL SENSOR SYSTEM

(71) Applicant: Valeo Schalter und Sensoren GmbH, Bietigheim-Bissingen (DE)

(72) Inventors: Sergio Fernandez, Bietigheim-Bissingen (DE); Shuyun Guo, Bietigheim-Bissingen (DE); Christoph Pfrang, Bietigheim-Bissingen (DE)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 572 days.

(21) Appl. No.: 17/771,215

(22) PCT Filed: Oct. 12, 2020

(86) PCT No.: PCT/EP2020/078573
§ 371 (c)(1),
(2) Date: Apr. 22, 2022

(87) PCT Pub. No.: WO2021/078557
PCT Pub. Date: Apr. 29, 2021

(65) Prior Publication Data
US 2022/0373660 A1    Nov. 24, 2022

(30) Foreign Application Priority Data

Oct. 25, 2019   (DE) .................... 10 2019 128 907.6

(51) Int. Cl.
*G01S 7/487*     (2006.01)
*G01R 29/02*     (2006.01)
(Continued)

(52) U.S. Cl.
CPC .......... *G01S 7/4876* (2013.01); *G01R 29/023* (2013.01); *G01S 17/10* (2013.01); *G01S 17/931* (2020.01)

(58) Field of Classification Search
CPC ...... G01S 7/4876; G01S 17/10; G01S 17/931; G01R 29/023
See application file for complete search history.

(56) References Cited

U.S. PATENT DOCUMENTS

| 2015/0268331 | A1* | 9/2015 | Koehler .................. G01S 7/497 356/5.01 |
| 2019/0129009 | A1  | 5/2019 | Eichenholz et al. |
| 2020/0191962 | A1* | 6/2020 | Farris ...................... G01S 17/10 |

FOREIGN PATENT DOCUMENTS

| CN | 108344984 A | 7/2018 |
| CN | 109891264 A | 6/2019 |

(Continued)

OTHER PUBLICATIONS

International Search Report and Written Opinion in corresponding International Application No. PCT/EP2020/078573, mailed Jan. 26, 2021 (12 pages).

(Continued)

*Primary Examiner* — Catherine T. Rastovski
*Assistant Examiner* — Yossef Korang-Beheshti
(74) *Attorney, Agent, or Firm* — Osha Bergman Watanabe & Burton LLP (57) ABSTRACT

According to a method for filtering measurement data of a sensor system (2), light pulses (5) reflected in the environment of the sensor system (2) are captured by means of an array (7) of optical detectors (8, 9, 10). A multiplicity of measurement signals (11, 12) are generated by means of the array (7) based on the captured light pulses. A computing unit (3) identifies a first measurement signal (11) whose pulse energy is greater than a specified minimum energy, (Continued)

wherein the first measurement signal (11) was generated by a first detector (8). A second measurement signal (12) is compared with the first measurement signal (11) by means of the computing unit (3), wherein the second measurement signal (12) was generated by a second detector (9), which is at a distance from the first detector (8) that is less than or equal to a specified maximum distance. The computing unit discards at least a part of the second measurement signal depending on a result of the comparison.

12 Claims, 3 Drawing Sheets

(51) Int. Cl.
*G01S 17/10* (2020.01)
*G01S 17/931* (2020.01)

(56) References Cited

FOREIGN PATENT DOCUMENTS

| | | |
|---|---|---|
| CN | 110121658 A | 8/2019 |
| DE | 102012021831 A1 | 5/2014 |
| DE | 102016118468 A1 | 3/2018 |
| EP | 2182378 A1 | 5/2010 |
| KR | 10-2019-0053953 A | 5/2019 |
| WO | 2018/075583 A1 | 4/2018 |

OTHER PUBLICATIONS

Office Action issued in counterpart Korean Patent Application No. 10-2022-7017502 mailed Oct. 17, 2024 (15 pages).
Office Action Issued in Corresponding CN Application No. 202080082327.1 dated Nov. 26, 2024 (22 Pages with English Translation).

\* cited by examiner

FILTERING MEASUREMENT DATA OF AN ACTIVE OPTICAL SENSOR SYSTEM

The present invention relates to a method for filtering measurement data of an active optical sensor system, wherein light pulses reflected in an environment of the sensor system are captured by means of an array of optical detectors of the sensor system and a multiplicity of measurement signals are generated by means of the array based on the captured light pulses. The invention furthermore relates to a corresponding sensor apparatus, to a motor vehicle, to a computer program, and to a computer-readable storage medium.

In active optical sensor systems, such as lidar systems, which can also be referred to as laser scanners, it may be the case that false-positive scanning points are identified that are not due to light reflected in the environment of the sensor system. These false-positive scanning points can be caused by noise or crosstalk, for example. Diffractive effects can lead to optical crosstalk between neighboring detectors in the sensor system. In addition, electrical signals from other detectors can be induced in neighboring detectors, which is referred to as electrical crosstalk.

Document WO 2018/075583 A1 describes a camera sensor that is connected to a control unit in order to clean the output signals of the camera sensor with respect to crosstalk. For this purpose, the output signals, or associated output values of each pixel of the sensor, are reduced depending on the amount of photo charges detected on neighboring pixels.

In the context of active optical sensor systems which are based on the measurement of signal times of flight to determine distance, as is the case with lidar systems, such an approach does not make sense, however, since the reduction of the sensor output values would entail a falsification of the measured signal time of flight and thus of the measured distance.

Against this background, it is an object of the present invention to specify an improved concept for filtering measurement data of an active optical sensor system, by means of which the occurrence of false-positive scanning points can be reduced.

According to the invention, the object is achieved by the respective subject matter of the independent claims. Advantageous developments and preferred embodiments are the subject matter of the dependent claims.

The improved concept is based on the idea of comparing measurement signals from different detectors that are located in a defined environment relative to one another if one of the measurement signals indicates a light pulse having a specified minimum energy. Depending on the comparison, the other measurement signal can be at least partially discarded.

According to the improved concept, a method for filtering measurement data of an active optical sensor system, in particular of an active optical sensor system installed on or in a motor vehicle, is specified. In this case, light pulses reflected in an environment, or by objects in the environment, of the sensor system are captured by means of an array of optical detectors of the sensor system. A multiplicity of measurement signals are generated by means of the array based on the captured light pulses, i.e., at least two measurement signals are generated. A computing unit, in particular of the sensor system, is used to identify from the multiplicity of measurement signals a first measurement signal which corresponds to a captured light pulse having a pulse energy that is greater than or equal to a specified minimum energy. The first measurement signal was generated here by a first detector of the array. The computing unit is used to compare a second measurement signal from the multiplicity of measurement signals with the first measurement signal, wherein the second measurement signal was generated by a second detector of the array. The first and the second detector are spaced apart in the array by a distance of less than or equal to a specified maximum distance. At least a part of the second measurement signal is discarded by means of the computing unit depending on a result of the comparison.

By definition, an active optical sensor system has a light source for emitting the light or light pulses or light pulses. The light source can in particular be in the form of a laser.

Furthermore, by definition, an active optical sensor system has at least one optical detector in order to capture reflected portions of the emitted light. According to the improved concept, the sensor system has at least the first and the second detector of the array.

Here and below, the term "light" can be understood to encompass electromagnetic waves in the visible range, infrared range, and/or ultraviolet range. Accordingly, the term "optical" can also be understood to relate to light in this sense.

The array of detectors can be understood in particular to mean a defined or regular arrangement of the optical detectors, in particular of the first and the second and one or more further optical detectors, in a linear or two-dimensional, regular arrangement.

The first and the second measurement signal are, in particular, respective output signals of the first and the second detector, for example respective voltage signals.

In particular, each of the optical detectors of the array generates one of the multiplicity of measurement signals.

The distance between the first and the second detector can be given, for example, by corresponding positions of the first and the second detector in the array. In particular, the specified maximum distance can correspond to a specified order of nearest neighbors. For example, the first and the second detector may be nearest neighbors, second nearest neighbors, third nearest neighbors, and so on. The maximum distance then restricts the corresponding order.

The first measurement signal includes in particular a pulse that reproduces the corresponding captured light pulse or is dependent on it or corresponds to it. The pulse energy of the light pulse can therefore be inferred from the pulse shape of the first measurement signal. In particular, a maximum amplitude and/or a pulse width of the pulse of the first measurement signal can be used to calculate the pulse energy.

The discarding of the part of the second measurement signal in particular corresponds to canceling or marking or discontinuing the use of the corresponding part of the second measurement signal, in particular by subsequent algorithms or functions that use the measurement signals of the active optical sensor system, for example for object recognition or the like. The discarding can thus be viewed as filtering of measurement data of the active optical sensor system, wherein the measurement data include in particular the measurement signals or the corresponding parts thereof.

The fact that at least a part of the second measurement signal is discarded can be understood to mean that the second measurement signal is completely discarded, or that only a specific time segment of the second measurement signal, in particular a time segment that indicates a false-positive scanning point. Further parts of the second measurement signal can, for example, continue to be used and can possibly indicate actual scanning points.

By comparing the first and the second measurement signal, false-positive scanning points can be identified, or the probability that the part of the second measurement signal corresponds to a false-positive scanning point can be ascertained or estimated.

Since crosstalk, i.e., optical or electrical crosstalk, is caused, for example, by reflected light pulses from highly reflective objects, the measurement signals of the first detector, corresponding, for example, to an actual scanning point, and of the part of the second measurement signal, corresponding, for example, to a false-positive scanning point, are correlated with one another and in particular have specific properties that are related to one another.

By restricting the method to first measurement signals that indicate a pulse energy having the specified minimum energy, account is taken of the fact that only reflected light pulses having a sufficiently high pulse energy are able to cause a significant amount of crosstalk on neighboring or adjoining optical detectors, with the result that the restriction reduces the risk of false-negative determinations. A false-negative determination can be understood to mean the erroneous discarding of a part of the second measurement signal that actually corresponds to a real scanning point.

The risk of false-negative determinations can also be reduced by the restriction to the second detector, which is at most at the specified maximum distance from the first detector, since the crosstalk is limited to a certain spatial region around the first detector.

Overall, the quality of the measurement data can be improved by filtering according to the improved concept, in that fewer false-positive scanning points occur, while at the same time the probability of false-negative determinations is kept low.

In accordance with at least one embodiment of the method according to the improved concept, a pulse height and/or a pulse width of the first measurement signal are/is determined by means of the computing unit in order to determine the pulse energy.

For example, the pulse energy can be viewed as being proportional to the pulse height and proportional to the pulse width. The identification of the first measurement signal can therefore include, for example, the identification from the multiplicity of measurement signals of a measurement signal with a correspondingly large pulse width and/or a correspondingly large pulse height.

The pulse height can correspond, for example, to a maximum amplitude of a pulse of the measurement signal.

Determining the pulse energy of the captured light pulse can be understood to mean determining a measure of the pulse energy on the basis of the first measurement signal. In particular, the pulse energy is not determined directly from the captured light pulse, but from the measurement signal that is caused by the light pulse.

As a rule, the higher the energy of the captured light pulse is, the higher is the maximum amplitude of the resulting measurement signal. However, depending on the configuration of the detector, saturation effects can occur above a specific amplitude, with the result that the pulses are broadened. Accordingly, both the maximum amplitude and the pulse width can be viewed as a measure of the energy. In particular, a pulse area under the pulse of the measurement signal can be viewed as a measure of the pulse energy.

According to at least one embodiment, a further pulse energy is determined by means of the computing unit based on a pulse height and/or a pulse width of the second measurement signal, and the part of the second measurement signal is discarded depending on a result of the comparison of the pulse energy with the further pulse energy.

In particular, the pulse energy is compared with the further pulse energy by means of the computing unit, and the computing unit discards the part of the second measurement signal in dependence on a result of the comparison.

The crosstalk due to a high-energy light pulse is usually not evenly distributed between the different detectors, so that a large part of the pulse energy goes to the first optical detector, and thus to a certain extent to the correct detector, and only a small part goes to the second detector.

According to at least one embodiment, the part of the second measurement signal is discarded by the computing unit only if a ratio of the pulse energy to the further pulse energy is less than or equal to a specified limit value.

In other words, pulses of the second measurement signal are not interpreted as false-positive scanning points if their pulse energy is greater than the limit value.

This takes account of the fact that the false-positive scanning points occur as points with a lower pulse energy and accordingly the risk of false-negative determinations is reduced.

According to at least one embodiment, a first capture time is determined by means of the computing unit based on the first measurement signal, and a second capture time is determined based on the second measurement signal. The part of the second measurement signal is discarded in dependence on a result of a comparison between the first capture time and the second capture time.

The first capture time here corresponds in particular to a time at which the reflected light pulse is captured by the first detector, which manifests itself in the signal shape or pulse shape of the first measurement signal. For example, the first capture time can correspond to a time at which a rising edge of the pulse of the first measurement signal exceeds a specified value. Alternatively, for example, a pulse center of the pulse of the first measurement signal can serve as the first capture time.

The second capture time corresponds to a time at which, according to the second measurement signal, a further light pulse was apparently captured by the second optical detector. The second capture time can, for example, correspond to a time at which the rising edge of the second measurement signal exceeds the specified value or to a center of the pulse of the second measurement signal. Alternatively, for example, a pulse center of the pulse of the second measurement signal can serve as the second capture time.

The time at which the light pulse is actually captured by the first detector is correlated with the time at which the crosstalk becomes noticeable in the second measurement signal, since both effects are due to the same captured light pulse. Accordingly, the light time of flight that results from the first light signal is similar to the apparent light time of flight that results from the second measurement signal. In other words, a radial distance of a point by which the reflected light pulse is reflected from the first detector is approximately equal to an apparent radial distance of an apparent reflection point from the second detector.

Because the discarding of the part of the second measurement signal has been restricted in dependence on the capture time, the risk of false-negative determinations can be further reduced.

According to at least one embodiment, the part of the second measurement signal is discarded by means of the computing unit only if a difference between the first capture time and the second capture time is less than or equal to a specified maximum difference.

According to at least one embodiment, the part of the second measurement signal is discarded only if, in particular discarded precisely when, the difference is less than or equal to the maximum difference, the ratio of the pulse energy to the further pulse energy is less than or equal to the limit value, the distance between the first and the second detector is less than or equal to the maximum distance, and the first measurement signal corresponds to a captured light pulse having a pulse energy that is greater than or equal to the minimum energy.

According to at least one embodiment, light pulses are emitted into the environment of the sensor system by means of the sensor system, in particular by means of a light source of the sensor system, and the reflected light pulses correspond to reflected portions of the emitted light pulses.

According to the improved concept, a sensor apparatus with a computing unit and an active optical sensor system is also specified. The sensor system has an array of optical detectors, wherein the array is configured to capture light pulses reflected in an environment of the sensor system and to generate a multiplicity of measurement signals based on the captured light pulses. The computing unit is configured to identify from the multiplicity of measurement signals a first measurement signal which corresponds to a captured light pulse having a pulse energy that is greater than or equal to a specified minimum energy, wherein the first measurement signal was generated by a first detector of the array. The computing unit is configured to compare a second measurement signal of the multiplicity of measurement signals with the first measurement signal, wherein the second measurement signal was generated by a second detector in the array. The first and the second detector are spaced apart in the array by a distance of less than or equal to a specified maximum distance. The computing unit is configured to discard at least a part of the second measurement signal depending on a result of the comparison.

In accordance with at least one embodiment of the sensor apparatus according to the improved concept, the sensor system contains a deflection apparatus, which is configured to direct the reflected light pulses to different positions of the array depending on the direction of incidence of the light pulses.

In accordance with at least one embodiment, the deflection apparatus is designed in such a way that it directs reflected light pulses whose directions of incidence correspond to a vertical scanning angle within a first angular range, onto the first detector. The deflection apparatus is furthermore designed in such a way that it directs reflected light pulses whose directions of incidence correspond to a vertical scanning angle within a second angular range, onto the second detector.

The first and the second angular range differ from one another, in particular the first and the second angular range are disjoint.

The optical crosstalk can result in parts of light pulses that are incident according to the first angular range being incident on the second detector or in part being incident on the second detector.

The deflection apparatus can contain, for example, a movable or rotatably mounted mirror, or a mirror element that is tiltable or pivotable about one or two axes, which can be designed, for example, as a microelectromechanical system, MIMS.

According to at least one embodiment, the computing unit is configured to determine a further pulse energy based on a pulse height and/or a pulse width of the second measurement signal and to discard the part of the second measurement signal depending on a result of a comparison of the pulse energy with the further pulse energy.

According to at least one embodiment, the computing unit is configured to determine a first capture time based on the first measurement signal, to determine a second capture time based on the second measurement signal, and to discard the part of the second measurement signal depending on a result of a comparison of the first capture time with the second capture time.

Further embodiments of the sensor apparatus according to the improved concept result directly from the different configurations of the method according to the improved concept and vice versa. In particular, the sensor apparatus can be configured or programmed to carry out a method according to the improved concept, or the sensor apparatus carries out a method according to the improved concept.

According to the improved concept, a motor vehicle with a sensor apparatus according to the improved concept is specified, wherein the sensor system of the sensor apparatus is installed in particular on or in the motor vehicle.

According to the improved concept, a computer program with instructions is specified which, when the computer program is executed by a sensor apparatus according to the improved concept, cause the sensor apparatus to carry out a method according to the improved concept.

According to the improved concept, a computer-readable storage medium is specified, on which a computer program according to the improved concept is stored.

Further features of the invention are evident from the claims, the figures and the description of the figures. The features and combinations of features that are cited in the description above and also the features and combinations of features that are cited in the description of the figures below and/or shown in the figures alone can be used not only in the respectively indicated combination but also in other combinations without departing from the scope of the invention. Embodiments of the invention that are not explicitly shown and explained in the figures, but emerge and are producible from the explained embodiments by virtue of separate combinations of features, are therefore also intended to be regarded as encompassed and disclosed. Embodiments and combinations of features which therefore do not have all the features of an originally formulated independent claim are also intended to be regarded as disclosed. Furthermore, embodiments and combinations of features that go beyond or differ from the combinations of features set out in the back-references of the claims are intended to be regarded as disclosed, in particular by the embodiments set out above.

Figure 1:
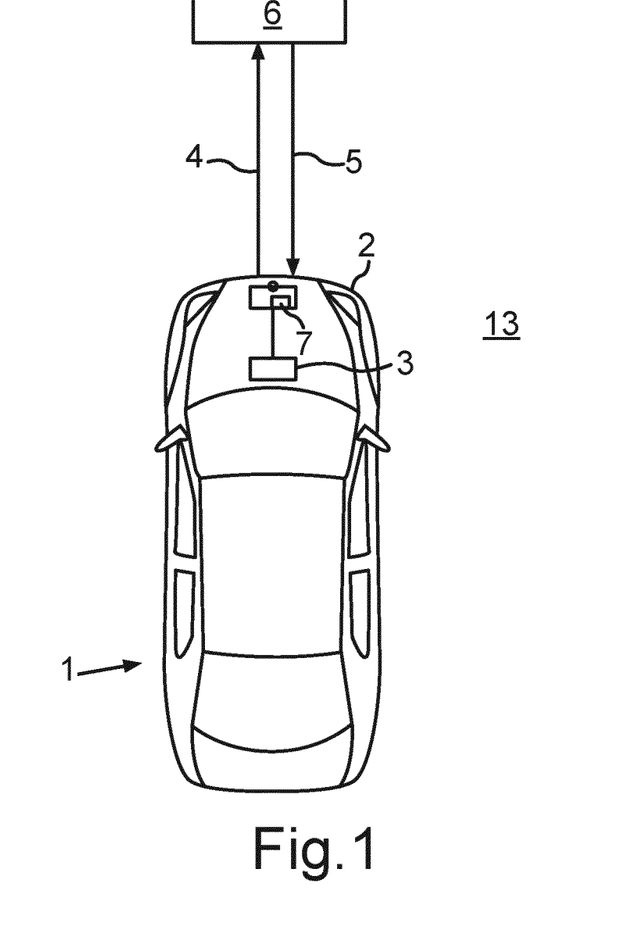
FIG. 1 shows a schematic illustration of a motor vehicle with an exemplary embodiment of a sensor apparatus according to the improved concept.

In the figures:

FIG. 1 illustrates a motor vehicle 1 which has a sensor apparatus 13 according to the improved concept.

The sensor apparatus 13 has an active optical sensor system 2, which is designed, for example, as a lidar system. The sensor system 2 is configured to emit light pulses 4, in particular infrared laser light pulses, into an environment of the sensor system 2 and thus of the motor vehicle 1 by means of a light source (not shown).

The emitted light pulses 4 can be at least partially reflected by an object 6 in the environment, and thus reflected light pulses 5 can be sent back in the direction of the sensor system 2. The sensor system 2 has an array 7 of optical detectors 8, 9, 10, which can capture the reflected light pulses 5 and can generate a multiplicity of measurement signals based on the captured light pulses. In particular, each detector 8, 9, 10 generates a corresponding measurement signal.

The sensor system 2 has, for example, a deflection apparatus 14 (see FIG. 2), which is able to direct the reflected light pulses 5, depending on their direction of incidence, onto different detectors 8, 9, 10 of the array 7.

The sensor apparatus 13 has a computing unit 3 which is coupled to the sensor system 2, in particular to the array 7, in order to receive the measurement signals.

Figure 2:
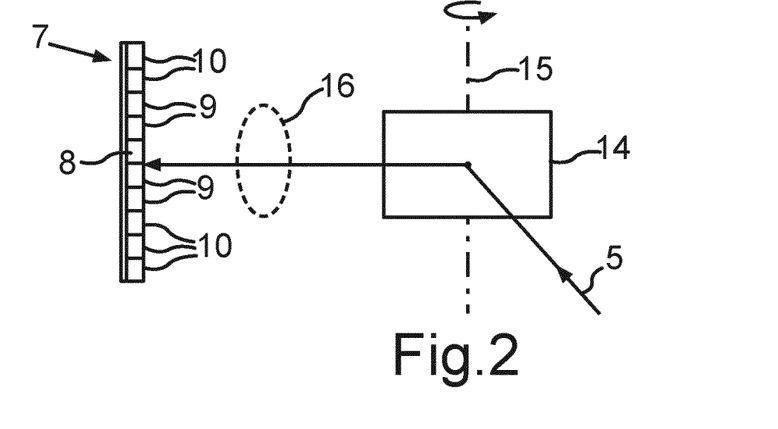
FIG. 2 shows a schematic illustration of an array of optical detectors and a deflection apparatus of a further exemplary embodiment of a sensor apparatus according to the improved concept.

FIG. 2 shows a schematic illustration of the array 7 and of the deflection apparatus 14 of the sensor system 2.

In the exemplary embodiment in FIG. 2, the optical detectors 8, 9, 10 are arranged, for example, linearly next to one another in order to form the array 7.

The deflection apparatus 14 has, for example, a mirror 14 that is mounted rotatably about an axis of rotation 15 and, depending on the rotational position, directs light pulses 5 onto the array 7 from different horizontal scanning angles or scanning directions. In this case, the horizontal scanning angles can be understood to mean angles which projections of the light pulses 5 into a plane perpendicular to the axis of rotation 15 enclose for example with the axis of rotation 15.

The axis of rotation 15 is in particular parallel to an arrangement direction of the detectors 8, 9, 10 in the array 7.

The light pulse 5 is directed onto different detectors 8, 9, 10 of the array 7, depending on the vertical scanning angle of the respectively arriving light pulse 5. Accordingly, a two-dimensional resolution of the sensor system 2 is made possible by combining the horizontal and vertical scanning angles. A corresponding light time-of-flight measurement based on the multiplicity of measurement signals can additionally be used to determine a radial distance between the corresponding reflection point on the object 6 and the array 7 or the respective detector 8, 9, 10, so that overall three-dimensional coordinates of the scanning points are given.

The vertical scanning angle corresponds here to an angle that the light pulse 5 encloses with the axis of rotation 15.

Optionally, the sensor system 2 can have one or more lenses or other optical elements 16 between the deflection apparatus 14 and the array 7. Alternatively or additionally, the sensor system 2 can have further optical elements in another part of the beam path of the reflected light pulses 5 and/or the emitted light pulses 4.

In the example in FIG. 2, the reflected light pulse 5 is directed onto a first optical detector 8 of the array 7 in accordance with the ray-optical imaging specifications. If the object 6 is an object having a high reflectivity, the energy or intensity of the reflected light pulse 5 can be comparatively high. Owing to diffractive effects, this can lead to optical crosstalk between the first detector 8 and second detectors 9 in an environment of the first detector 8 on the array 7, for example, and also to electrical crosstalk between the first detector 8 and the second detectors 9.

The second detectors 9 are located in this case within a specified maximum range around the first detector 8. In the schematic example of FIG. 2, the second detectors 9 are the next or the next but one neighbors of the first detector 8. Higher-order neighbors of the first detector 8 are shown in FIG. 2 as further optical detectors 10.

The following text describes how the measurement signals of the detectors 8, 9, 10, in particular of the second detectors 9, can be filtered using the improved concept in order to reduce the influence of electrical and/or optical crosstalk and the associated false-positive scanning points.

Figure 3:
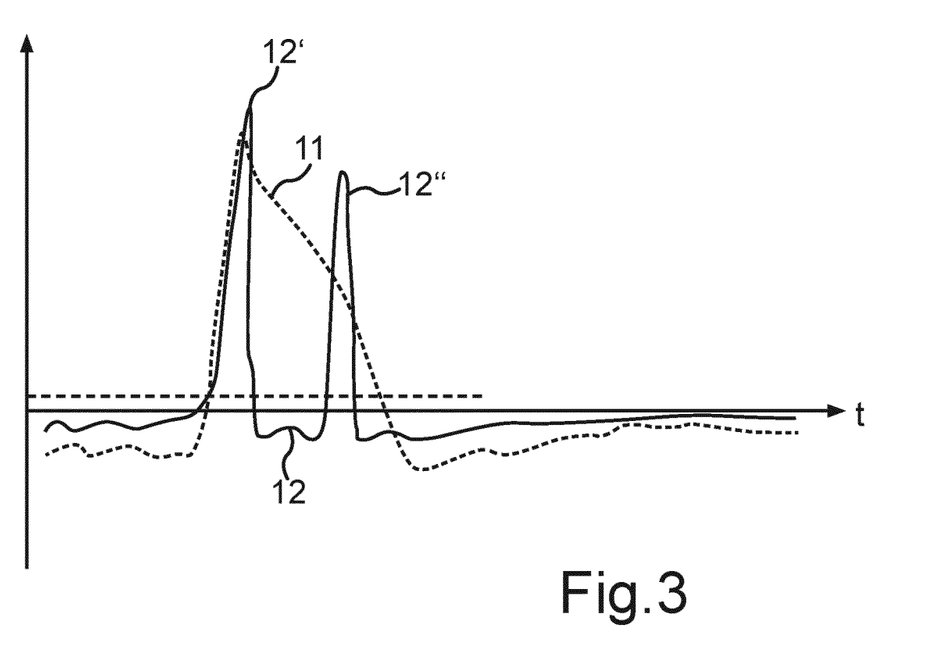
FIG. 3 shows a schematic illustration of measurement signals of a further exemplary embodiment of a sensor apparatus according to the improved concept.

Two measurement signals 11, 12 are sketched in this regard as a function of time t in FIG. 3. A first measurement signal 11 corresponds, for example, to a measurement signal that was generated by the first detector 8 based on the reflected light pulse 5. A second measurement signal 12 corresponds, for example, to a measurement signal that was generated by one of the second optical detectors 9.

The computing unit 3 is configured in particular to determine whether the second measurement signal 12 or a part of the second measurement signal 12 corresponds to a false-positive scanning point.

For this purpose, the computing unit 3 can initially ascertain whether the first measurement signal 11 corresponds to a captured light pulse whose pulse energy is greater than a specified minimum energy. Only such light pulses are likely to result in optical or electrical crosstalk. For example, the pulse energy can be determined based on a pulse width of the first measurement signal 11. The minimum energy can correspond to a pulse width, for example, which corresponds to a time-of-flight difference. The time-of-flight difference is equivalent here to a difference in the radial distance. The difference in the radial distance, which corresponds to the time-of-flight difference, can be in the order of 50 to 150 centimeters, for example approximately 120 centimeters.

If the pulse energy according to the first measurement signal 11 is greater than the minimum energy, the computing unit 3 can, for example, determine a capture time of the first measurement signal 11 and a capture time of the second measurement signal 12. The respective capture time can then be determined, for example, as the time at which a rising edge of the respective measurement signal 11, 12 exceeds a specified minimum value, which is indicated in FIG. 3, for example, by a horizontal dashed line.

As can be seen in FIG. 3, the second measurement signal 12 can include a number of different pulses 12', 12". The first pulse 12' here provides an earlier capture time than the second pulse 12".

The computing unit 3 compares the capture time of the first measurement signal 11 with a capture time of the second measurement signal 12, for example the respective capture times of the first pulse 12' and of the second pulse 12". A false-positive detection owing to the measurement signal 12 can only be assumed with sufficient probability if the first capture time of the first measurement signal 11 and the corresponding second capture time of the second measurement signal 12 are close enough to one another.

In the present example, the capture time of the first measurement signal 11 and the capture time of the first pulse 12' of the second measurement signal 12 are almost the same, so that the first pulse 12' is a potential false-positive scanning point. However, the second pulse 12" has a capture time that is too far removed from the capture time of the first measurement signal 11 for it to be a false-positive scanning point with any sufficient probability. The second pulse 12″ is therefore, with a high degree of probability, an actual scanning point that is in particular further away from the sensor system 2 than the first scanning point given by the first measurement signal 11.

The computing unit 3 can now also determine a pulse energy of the second measurement signal 12, in particular of the first pulse 12′. The computing unit 3 can relate the pulse energy of the first measurement signal 11 to the pulse energy of the first pulse 12′ of the second measurement signal 12 and calculate the ratio of the pulse energies. A false-positive scanning point can be assumed only if the pulse energy of the first measurement signal 11 is significantly greater, i.e., greater by at least a specified factor, than the pulse energy of the first pulse 12′ of the second measurement signal 12. This is the case in the present example, which can be seen, for example, from the significantly smaller pulse width of the first pulse 12′ in comparison with the pulse of the first measurement signal 11.

In summary, the computing unit 3 has ascertained that the first pulse 12′ has a sufficiently small pulse energy compared with the pulse energy of the first measurement signal 11, indicates almost the same radial distance from the array 7, and was generated by a second detector 9 located in the immediate environment of the first detector 8. In addition, the pulse energy of the first measurement signal 11 is comparatively high.

The computing unit 3 can therefore discard the first pulse 12′ of the second measurement signal 12, that is to say in particular mark it or store the information that the first pulse 12′ should not be used by further functions or algorithms.

Figure 4:
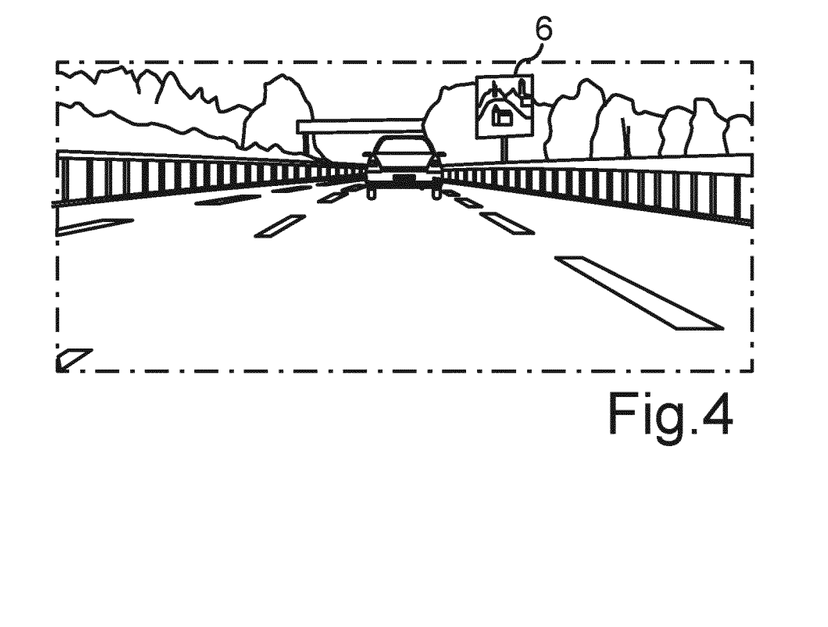
FIG. 4 shows a schematic illustration of a possible environment of a sensor apparatus according to the improved concept.

FIG. 4 schematically shows an environment of a motor vehicle 1, as is shown in FIG. 1. The object 6 is shown, for example, as a traffic sign or the like.

Since such signs are regularly highly reflective target objects, the risk of false-positive scanning points is particularly high here.

Figure 5:
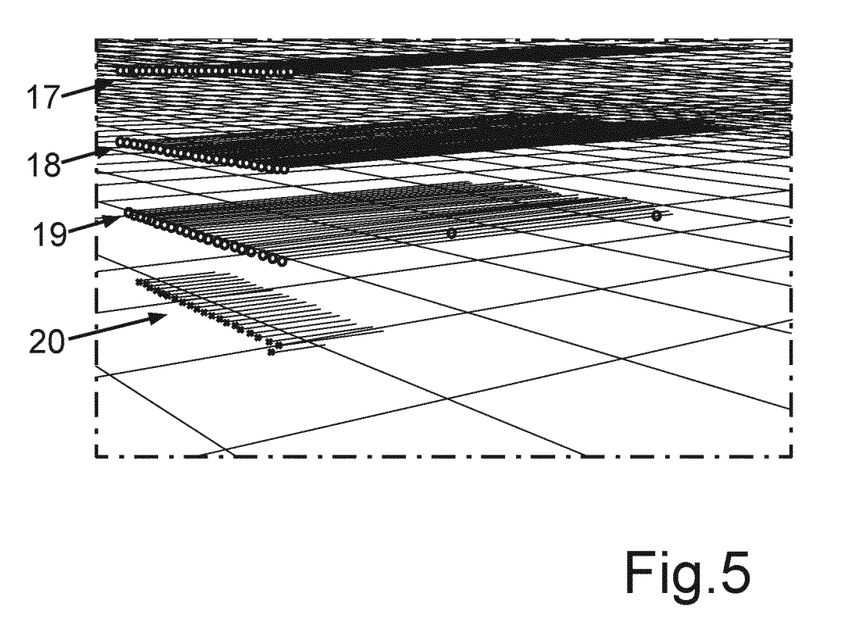
FIG. 5 shows a schematic illustration of scanning points and filtered scanning points of a further exemplary embodiment of a sensor apparatus according to the improved concept.

FIG. 5 illustrates schematically corresponding, by means of a sensor system 2, as described with reference to FIGS. 1 to 3. In particular, first scanning points 17 of a first layer, second scanning points 18 of a second layer, and third scanning points 19 of a third layer are shown. In this case, the different locations correspond, for example, to scanning points which were generated by different detectors 8, 9, 10. Each layer 17, 18, 19 contains a multiplicity of scanning points which correspond to different horizontal scanning angles.

The perspective lines connected to the points schematically indicate the associated pulse energies.

False-positive scanning points 20 marked with "x" are also shown in FIG. 5. These were generated in the manner described, for example, by optical or electrical crosstalk.

Based on the improved concept, these false-positive scanning points 20 can, as described above, be filtered out of the measurement data of the sensor system 2 and not taken into account any further. If this filtering were not carried out, the apparent extent of the object 6 would be greater than its actual extent.

According to the improved concept, as described, measurement data of an active optical sensor system can be filtered in order to identify false-positive scanning points, without significantly increasing the risk of false-negative determinations.

The invention claimed is:
1. A method for filtering measurement data of an active optical sensor system, comprising:

capturing light pulses reflected in an environment of the sensor system by an array of optical detectors of the sensor system;
generating a multiplicity of measurement signals by the array based on the captured light pulses;
identifying, by a computing unit and from the multiplicity, a first measurement signal which corresponds to a captured light pulse having a pulse energy that is greater than or equal to a specified minimum energy, wherein the first measurement signal is generated by a first detector of the array;
comparing, by the computing unit, a second measurement signal of the multiplicity with the first measurement signal, wherein the second measurement signal is generated by a second detector of the array, and the first and the second detector are spaced apart in the array by a distance of less than or equal to a specified maximum distance;
discarding, by the computing unit, at least a part of the second measurement signal depending on a result of the comparison;
determining, by the computing unit, a further pulse energy based on a pulse height and/or a pulse width of the second measurement signal; and
discarding, by the computing unit, the part of the second measurement signal depending on a result of a comparison of the pulse energy with the further pulse energy.

2. The method as claimed in claim 1, wherein a pulse height and/or a pulse width of the first measurement signal are/is determined by the computing unit in order to determine the pulse energy.

3. The method as claimed in claim 1, wherein the part of the second measurement signal is discarded only if a ratio of the pulse energy to the further pulse energy is less than or equal to a specified limit value.

4. The method as claimed in claim 1, wherein the computing unit is further configured to: determine a first capture time based on the first measurement signal, and determine a second capture time based on the second measurement signal, wherein the part of the second measurement signal is discarded depending on a result of a comparison of the first capture time with the second capture time.

5. The method as claimed in claim 4, wherein the part of the second measurement signal is discarded only if a difference between the first capture time and the second capture time is less than or equal to a specified maximum difference.

6. The method as claimed in claim 1, wherein light pulses are emitted into the environment by means of the sensor system, and the reflected light pulses correspond to reflected portions of the emitted light pulses.

7. A sensor apparatus comprising:
a computing unit; and
an active optical sensor system having an array of optical detectors, wherein the array is configured to capture light pulses reflected in an environment of the sensor system, and generate a multiplicity of measurement signals based on the captured light pulses;
wherein the computing unit is configured to:
identify from the multiplicity a first measurement signal which corresponds to a captured light pulse having a pulse energy that is greater than or equal to a specified minimum energy, wherein the first measurement signal was generated by a first detector of the array;
compare a second measurement signal of the multiplicity with the first measurement signal, wherein the second measurement signal was generated by a second detector of the array, and the first and the second detector are spaced apart in the array by a distance of less than or equal to a specified maximum spacing; and discard at least a part of the second measurement signal depending on a result of the comparison;

determine a further pulse energy based on a pulse height and/or a pulse width of the second measurement signal; and discard the part of the second measurement signal depending on a result of a comparison of the pulse energy with the further pulse energy.

8. The sensor apparatus as claimed in claim 7, wherein the sensor system contains a deflection apparatus which is configured to direct the reflected light pulses to different positions of the array depending on the direction of incidence of the light pulses.

9. The sensor apparatus as claimed in claim 8, wherein the deflection apparatus is arranged for directing reflected light pulses whose directions of incidence correspond to a vertical scanning angle within a first angular range onto the first detector, and directing reflected light pulses whose directions of incidence correspond to a vertical scanning angle within a second angular range onto the second detector.

10. The sensor apparatus as claimed in claim 7, wherein the computing unit is further configured to:

determine a first capture time based on the first measurement signal;

determine a second capture time based on the second measurement signal; and discard the part of the second measurement signal depending on a result of a comparison of the first capture time with the second capture time.

11. A motor vehicle with a sensor apparatus as claimed in claim 7.

12. A nontransitory computer-readable medium comprising instructions which, when the computer program is executed by a sensor apparatus as claimed in claim 7 cause the sensor apparatus to carry out a method comprising:

capturing light pulses reflected in an environment of the sensor system by an array of optical detectors of the sensor system;

generating a multiplicity of measurement signals by the array based on the captured light pulses;

identifying, by a computing unit and from the multiplicity, a first measurement signal which corresponds to a captured light pulse having a pulse energy that is greater than or equal to a specified minimum energy, wherein the first measurement signal is generated by a first detector of the array;

comparing, by the computing unit, a second measurement signal of the multiplicity with the first measurement signal, wherein the second measurement signal is generated by a second detector of the array, and the first and the second detector are spaced apart in the array by a distance of less than or equal to a specified maximum distance;

discarding, by the computing unit, at least a part of the second measurement signal depending on a result of the comparison;

determining, by the computing unit, a further pulse energy based on a pulse height and/or a pulse width of the second measurement signal; and discarding, by the computing unit, the part of the second measurement signal depending on a result of a comparison of the pulse energy with the further pulse energy.

* * * * *